(12) United States Patent
Ogihara

(10) Patent No.: US 6,999,740 B2
(45) Date of Patent: Feb. 14, 2006

(54) SEMICONDUCTOR INTEGRATED CIRCUIT AND RADIO COMMUNICATION APPARATUS USING SAME

(75) Inventor: Takahiro Ogihara, Kanagawa (JP)

(73) Assignee: Sony Corporation (JP)

( * ) Notice: Subject to any disclaimer, the term of this patent is extended or adjusted under 35 U.S.C. 154(b) by 698 days.

(21) Appl. No.: 10/084,318

(22) Filed: Feb. 28, 2002

(65) Prior Publication Data

US 2002/0119762 A1 Aug. 29, 2002

(30) Foreign Application Priority Data

Feb. 28, 2001 (JP) ................................. P2001-053406

(51) Int. Cl.
H04B 7/00 (2006.01)

(52) U.S. Cl. ................. 455/234.1; 455/252.1; 455/136; 330/269; 330/151

(58) Field of Classification Search .............. 455/234.1, 455/232.1, 239.1, 240.1, 245.1, 251.1, 252.1, 455/115.3, 127.2, 136, 138, 144, 194.2, 200.1; 330/269

See application file for complete search history.

(56) References Cited

U.S. PATENT DOCUMENTS

| 6,114,911 A | * | 9/2000 | Iwai et al. ................. 330/295 |
| 6,121,840 A | * | 9/2000 | Sakusabe .................. 330/277 |
| 6,738,601 B1 | * | 5/2004 | Rofougaran et al. ....... 455/66.1 |

* cited by examiner

*Primary Examiner*—Edward F. Urban
*Assistant Examiner*—T. Nguyen
(74) *Attorney, Agent, or Firm*—Rader, Fishman & Grauer PLLC; Ronald P. Kananen

(57) ABSTRACT

An amplifier circuit unit including a signal amplifying transistor is provided with a first bypass circuit unit for bypassing a part of an input signal to a ground side according to the strength of the input signal, and a second bypass circuit unit for bypassing a part of the input signal to an output side according to the strength of the input signal, whereby gain attenuation control is effected. Also, the amplifier circuit unit is provided with a control circuit unit for decreasing the drain bias current of the signal amplifying transistor when the first bypass circuit unit bypasses the part of the input signal to the ground side, and interrupting the drain bias current of the signal amplifying transistor when the second bypass circuit unit bypasses the part of the input signal to the output side, whereby control of the drain bias current is effected.

20 Claims, 4 Drawing Sheets

|  | GAIN (dB) | DRAIN BIAS CURRENT (mA) | INPUT SIGNAL ATTENUATION (dB) |
|---|---|---|---|
| HIGH GAIN | 15 | 10 | 0 |
| MEDIUM GAIN | 5 | 3 | 7 |
| LOW GAIN | -5 | 1 | 12 |

SEMICONDUCTOR INTEGRATED CIRCUIT AND RADIO COMMUNICATION APPARATUS USING SAME

BACKGROUND OF THE INVENTION

The present invention relates to a semiconductor integrated circuit and a radio communication apparatus using the same and, particularly to a compound FET (field-effect transistor) semiconductor integrated circuit suitable for high-frequency applications and a radio communication apparatus such as a portable telephone using the semiconductor integrated circuit as a gain-controlled amplifier circuit in a RF front end unit thereof.

A compound FET semiconductor integrated circuit suitable for high-frequency applications is generally used in the RF front end unit of a high-frequency radio communication apparatus typified by a portable telephone. In order to avoid interference of intermodulation distortion from a signal wave on another channel, an RF front end amplifier, which is one such semiconductor integrated circuit, is required to have low distortion characteristics.

The Input Third-Order Intercept Point (IIP3) is generally used as an index indicating the distortion characteristics of an amplifier. The IIP3 required of a front end amplifier in a personal handyphone (PHS) or a digital cellular telephone (PDC) in Japan is about minus several dBm. A gain of about 15 dB and an IIP3 of about −5 dBm can be readily achieved at a drain bias current of about 2 to 3 mA, and thus no practical problems are presented.

However, since a CDMA (Code Division Multiple Access) system whose service has recently been started as another system uses an FDD (Frequency Division Duplex) system that simultaneously transmits and receives, a cross-modulation distortion interference wave newly results from the interference of a transmission wave and a signal wave of another system using the same frequency band. To avoid the effects of the interference wave requires still lower distortion characteristics and an IIP3 performance of plus several dBm.

To achieve the IIP3 performance of plus several dBm requires about two to three times the drain bias current mentioned above. In addition, to deal with the interference of intermodulation distortion from a signal on another channel requires the provision for three standards: a strong electric field; a medium electric field, and a weak electric field, therefore a gain control function is essential.

FIG. 5 is a circuit diagram showing a conventional example of a single-stage, gain-controlled amplifier circuit generally used in the CDMA system.

In FIG. 5, the gain-controlled amplifier circuit according to the conventional example comprises an amplifier circuit unit 101 and a gain control circuit unit 102. The gain-controlled amplifier circuit includes: a signal input terminal 103 to which an input signal RFin is applied; a signal output terminal 104 from which an output signal RFout is derived; bias input terminals 105 and 106 to which bias voltages VDD1 and VDD2 are applied, respectively; a bias input terminal 107 to which a bias voltage VGG is applied; and a gain control terminal 108 to which a gain control voltage CTL is applied externally.

The amplifier circuit unit 101 comprises: a signal amplifying FET Q1 for amplifying the input signal RFin inputted through the signal input terminal 103; a bias resistance Rg1 for supplying a gate bias voltage to the FET Q1; and a choke coil Lb for supplying a drain bias voltage to the FET Q1.

The gain control circuit unit 102 comprises: a signal bypassing FET Q2 for bypassing the input signal RFin to a ground side; a resistance Rg2 for supplying the gain control voltage CTL to a gate of the FET Q2; a resistance Rg3 for supplying a source bias voltage to the FET Q2; a resistance Rg4 for supplying a drain bias voltage to the FET Q2; a coupling capacitance Cb for bypassing the input signal RFin; and a grounding capacitance Cs.

The gain-controlled amplifier circuit utilizes the fact that by changing the gain control voltage CTL applied to the gain control terminal 108, the drain-to-source resistance of the signal bypassing FET Q2 functions as a variable resistance. The gain-controlled amplifier circuit bypasses a part of the input signal RFin to the ground side according to the strength of the input signal RFin, thereby effecting gain control.

However, since the semiconductor integrated circuit, or the gain-controlled amplifier circuit according to the conventional example formed as described above, bypasses a part of the input signal RFin to the ground side, the gain is decreased by the gain control and the IIP3 characteristics are correspondingly improved, but this represents an overdesigned system.

The reason why gain control needs to be effected in the system is because amplification of the input signal RFin in a preceding stage correspondingly increases the load of a block in a succeeding stage to deal with distortion characteristics and hence the load needs to be lightened. Therefore, improving the distortion characteristics, that is, IIP3 characteristics, in the preceding stage more than necessary has no meaning when the system as a whole is considered.

Rather than improving the IIP3 characteristics by gain attenuation, it is advantageous to direct attention to reducing the drain bias current, that is, current consumption. A portable telephone, in particular, is powered by a battery and is limited in battery capacity because of its small size. Thus, a portable telephone is required to consume as little current as possible for longer call and standby time, and accordingly, reduction of current consumption is very important.

FIG. 6 shows an example of the dependence of gain and IIP3 on drain bias current at the time of a maximum gain (no gain attenuation control) in the conventional gain-controlled amplifier circuit using a GaAs FET. In this case, the drain bias current is adjusted by controlling the bias voltage VGG supplied to the bias input terminal 107.

As is clear from FIG. 6, the gain is decreased and the IIP3 also is degraded as the drain bias current is reduced. When converted into gain control step intervals, the standards of a strong electric field, a medium electric field, and a weak electric field required in a CDMA portable telephone system correspond to about 10 dB. Thus, the conditions for changing from a maximum gain of about 15 dB to about 5 dB and −5 dB while maintaining the IIP3 at about 4 to 5 dBm in FIG. 6 are summarized in FIG. 7. FIG. 7 shows the relationship between drain bias current and input signal attenuation at the time of gain attenuation for maintaining the IIP3 at a fixed level.

Hence, a good combination of the drain bias current and the gain attenuation condition can drastically reduce current consumption at the time of the medium electric field and the weak electric field. The gain-controlled amplifier circuit according to the conventional example described above, however, causes a very great variation in gain in response to a current variation, especially at the time of a low drain bias current of about 1 mA, thus presenting a problem in terms of gain stability and variations.

SUMMARY OF THE INVENTION

The present invention has been made in view of the above problem, and it is accordingly an object of the present invention to provide a semiconductor integrated circuit and a radio communication apparatus using the same that make it possible to reduce current consumption at the time of gain attenuation while maintaining IIP3 characteristics at an undegraded level and achieve high stability at the time of attenuation (negative gain).

According to the present invention, there is provided a semiconductor integrated circuit including: at least one signal amplifying transistor for amplifying an input signal supplied to a gate thereof; a first bypassing means for bypassing a part of the input signal to a ground side according to the strength of the input signal; and a second bypassing means for bypassing a part of the input signal to an output side according to the strength of the input signal.

In the thus formed semiconductor integrated circuit, according to the strength of the input signal, the first bypassing means bypasses a part of the input signal to the ground side and the second bypassing means bypasses a part of the input signal to the output side. Thus, by controlling a combination of the means stepwise according to electric field strength, for example, a strong electric field, a medium electric field, and a weak electric field, it is possible to realize gain attenuation control while maintaining IIP3 characteristics at an undegraded level.

DETAILED DESCRIPTION OF PREFERRED EMBODIMENTS

Preferred embodiments of the present invention will hereinafter be described in detail with reference to the drawings.

[First Embodiment]

Figure 1:
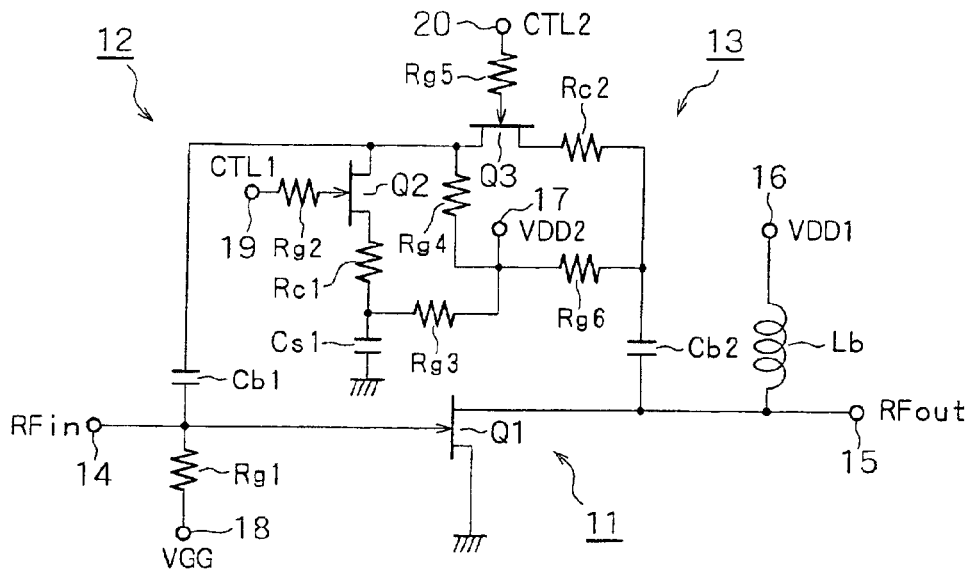
FIG. 1 is a circuit diagram showing a gain-controlled radio-frequency amplifier circuit according to a first embodiment of the present invention.

FIG. 1 is a circuit diagram showing a gain-controlled radio-frequency amplifier circuit, which is a semiconductor integrated circuit according to a first embodiment of the present invention.

The gain-controlled radio-frequency amplifier circuit according to the first embodiment includes an amplifier circuit unit 11 and the first and second bypass circuit units 12 and 13. The gain-controlled radio-frequency amplifier circuit according to the first embodiment includes: a signal input terminal 14 to which an input signal RFin is applied; a signal output terminal 15 from which an output signal RFout is derived; bias input terminals 16 and 17 to which bias voltages VDD1 and VDD2 are applied, respectively; a bias input terminal 18 to which a bias voltage VGG is applied; and bypass control terminals 19 and 20 to which bypass control voltages CTL1 and CTL2 are externally applied, respectively. The first and second bypass circuit units 12 and 13 function as a gain control circuit unit.

The amplifier circuit unit 11 includes at least one signal amplifying FET Q1, a bias resistance Rg1, and a choke coil Lb. The signal amplifying FET Q1 has a gate connected to the signal input terminal 14, a drain connected to the signal output terminal 15, and a source grounded. The signal amplifying FET Q1 amplifies and outputs the input signal RFin inputted through the signal input terminal 14.

The bias resistance Rg1 is connected between the gate of the signal amplifying FET Q1 and the bias input terminal 18 and supplies the gate of the signal amplifying FET Q1 with a gate bias voltage in proportion to the bias voltage VGG applied to the bias input terminal 18. The choke coil Lb is connected between the drain of the signal amplifying FET Q1 and the bias input terminal 16 and supplies the drain of the signal amplifying FET Q1 with a drain bias voltage in proportion to the bias voltage VDD1 applied to the bias input terminal 16.

The first bypass circuit unit 12 includes a signal bypassing FET Q2, a bypass signal strength adjusting resistance Rc1, resistances Rg2 to Rg4, a coupling capacitance Cb1, and a grounding capacitance Cs1. One end of the coupling capacitance Cb1 is connected to the signal input terminal 14 or the gate of the signal amplifying FET Q1. The signal bypassing FET Q2 has a drain connected to the other end of the coupling capacitance Cb1.

The resistance Rg2 is connected between a gate of the signal bypassing FET Q2 and the bypass control terminal 19 and supplies the gate of the signal bypassing FET Q2 with the bypass control voltage CTL1 applied to the bypass control terminal 19. The bypass signal strength adjusting resistance Rc1 has one end connected to a source of the signal bypassing FET Q2 and the other end grounded via the grounding capacitance Cs1.

The resistance Rg3 is connected between the other end of the bypass signal strength adjusting resistance Rc1 and the bias input terminal 17 and supplies a source bias voltage in proportion to the bias voltage VDD2 applied to the bias input terminal 17 to the source of the signal bypassing FET Q2 via the bypass signal strength adjusting resistance Rc1. The resistance Rg4 is connected between the drain of the signal bypassing FET Q2 and the bias input terminal 17 and supplies the drain of the signal bypassing FET Q2 with a drain bias voltage in proportion to the bias voltage VDD2 applied to the bias input terminal 17.

The second bypass circuit unit 13 comprises a signal bypassing FET Q3, a bypass power adjusting resistance Rc2, resistances Rg5 and Rg6, and a coupling capacitance Cb2. The signal bypassing FET Q3 has a drain connected to the drain of the signal bypassing FET Q2. The resistance Rg5 is connected between a gate of the signal bypassing FET Q3 and the bypass control terminal 20 and supplies the gate of the signal bypassing FET Q3 with the bypass control voltage CTL2 applied to the bypass control terminal 20.

The bypass power adjusting resistance Rc2 has one end connected to a source of the signal bypassing FET Q3 and the other end connected to the drain of the signal amplifying FET Q1 (signal output terminal 15) via the coupling capacitance Cb2. The resistance Rg6 is connected between the other end of the bypass power adjusting resistance Rc2 and the bias input terminal 17 and supplies a source bias voltage in proportion to the bias voltage VDD2 applied to the bias input terminal 17 to the source of the signal bypassing FET Q3 via the bypass power adjusting resistance Rc2.

The thus formed, gain-controlled radio-frequency amplifier circuit according to the first embodiment controls gain attenuation by effecting stepwise control of the bypass control voltages CTL1 and CTL2 applied to the bypass control terminals 19 and 20 according to the strength of the input signal RFin, for example, a strong electric field, a medium electric field, and a weak electric field. The signal amplifying FET Q1 and the signal bypassing FETs Q2 and Q3 are each formed by a device using a compound semiconductor.

The interference wave standard of CDMA in Japan (for example a CDMA-ONE system), for example, requires that an FER (Frame Error Rate)≦1% be satisfied under the following conditions: as for an interference two-wave input level, −21 dBm for a strong electric field, −32 dBm for a medium electric field, and −43 dBm for a weak electric field; and, as for a desired wave input level, −79 dBm for a strong electric field, −90 dBm for a medium electric field, and −101 dBm for a weak electric field.

Gain control operations at the times of high gain, medium gain, and low gain (attenuation) in the gain-controlled radio-frequency amplifier circuit formed as described above will be described next.

At the time of high gain, the signal bypassing FETs Q2 and Q3 are both turned off by controlling the bypass control voltages CTL1 and CTL2 applied to the bypass control terminals 19 and 20. This is equivalent to setting to infinite the drain-to-source resistance of each of the signal bypassing FETs Q2 and Q3. The drain bias current of the signal amplifying FET Q1 is set to a desired value, for example, the high gain condition shown in FIG. 7 by controlling the bias voltage VGG applied to the bias input terminal 18. Thus, the gain-controlled radio-frequency amplifier circuit completely blocks a signal to the bypass (first and second bypass circuit units 12 and 13), and therefore obtains a maximum gain.

At the time of medium gain, the signal bypassing FET Q2 is fully turned on and the signal bypassing FET Q3 is turned off by controlling the bypass control voltages CTL1 and CTL2 applied to the bypass control terminals 19 and 20. Thus, since the signal bypassing FET Q3 is off, the second bypass circuit unit 13 completely blocks the bypass of a signal to the output side. On the other hand, the first bypass circuit unit 12 bypasses to the ground side a portion corresponding to the signal strength determined by the drain-to-source on resistance of the signal bypassing FET Q2 and the bypass signal strength adjusting resistance Rc1. As a result, the gain is decreased.

Figures 6, 7:
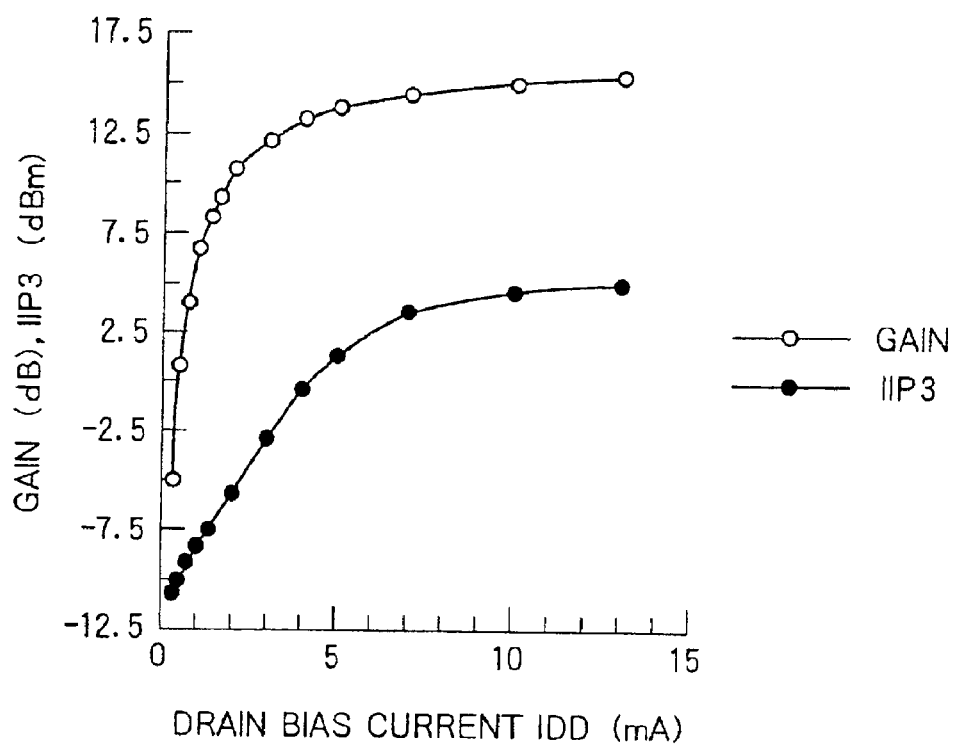
FIG. 6 is a diagram showing the dependence of gain and IIP3 on drain bias current at the time of no gain attenuation in the gain-controlled radio-frequency amplifier circuit according to the conventional example.
FIG. 7 is a diagram showing a relation between drain bias current and input signal attenuation at the time of gain attenuation for maintaining IIP3 at a fixed level.

In addition, the drain bias current of the signal amplifying FET Q1 is set to the desired value by controlling the bias voltage VGG. For example, the strength of the bypassed signal to the ground side (amount of attenuation) and the drain bias current are set to medium gain conditions, as shown in FIG. 7. Thus, the gain-controlled radio-frequency amplifier circuit can obtain the desired medium gain.

At the time of low gain (attenuation), the signal bypassing FET Q2 is turned off and the signal bypassing FET Q3 is turned on by controlling the bypass control voltages CTL1 and CTL2. Thus, since the signal bypassing FET Q2 is off, the first bypass circuit unit 12 completely blocks the bypass of a signal to the ground side. On the other hand, the second bypass circuit unit 13 bypasses to the output side a portion corresponding to the signal strength determined by the drain-to-source on resistance of the signal bypassing FET Q3 and the bypass power adjusting resistance Rc2.

In addition, the drain bias current of the signal amplifying FET Q1 is interrupted by controlling the bias voltage VGG. When the drain bias current of the signal amplifying FET Q1 is interrupted, the signal amplifying FET Q1 no longer functions as an amplifier (active device). Only a coupling capacitance determined by the gate-to-drain capacitance Cgd exists between the gate and the drain of the signal amplifying FET Q1.

In addition, since the gate-to-drain capacitance Cgd of a GaAs FET with a gate width of 400 μm, for example, is about 0.1 pF, the amount of signal attenuation in the gate-to-drain path of the signal amplifying FET Q1 at a frequency in a 800-MHz band reaches twenty-odd dB. Therefore, when the amount of attenuation in the bypass of the signal bypassing FET Q3 is set to a few dB, the amount contributed by the signal amplifying FET Q1 to attenuation may be ignored.

As described above, because of a passive operation that attenuates the signal under this condition by a portion corresponding to a signal strength determined by the drain-to-source on resistance of the signal bypassing FET Q3 and the bypass power adjusting resistance Rc2 and then outputs the signal, the signal essentially has a low distortion. In addition, since an active operation condition with unstable gain in which the signal amplifying FET Q1 is set to a low drain bias current is not used, it is possible to achieve a stable operation. Furthermore, since the drain bias current of the signal amplifying FET Q1 can be interrupted completely, the gain-controlled radio-frequency amplifier circuit according to the first embodiment may be said to have an excellent configuration also in terms of reduction of current consumption.

[Second Embodiment]

Figure 2:
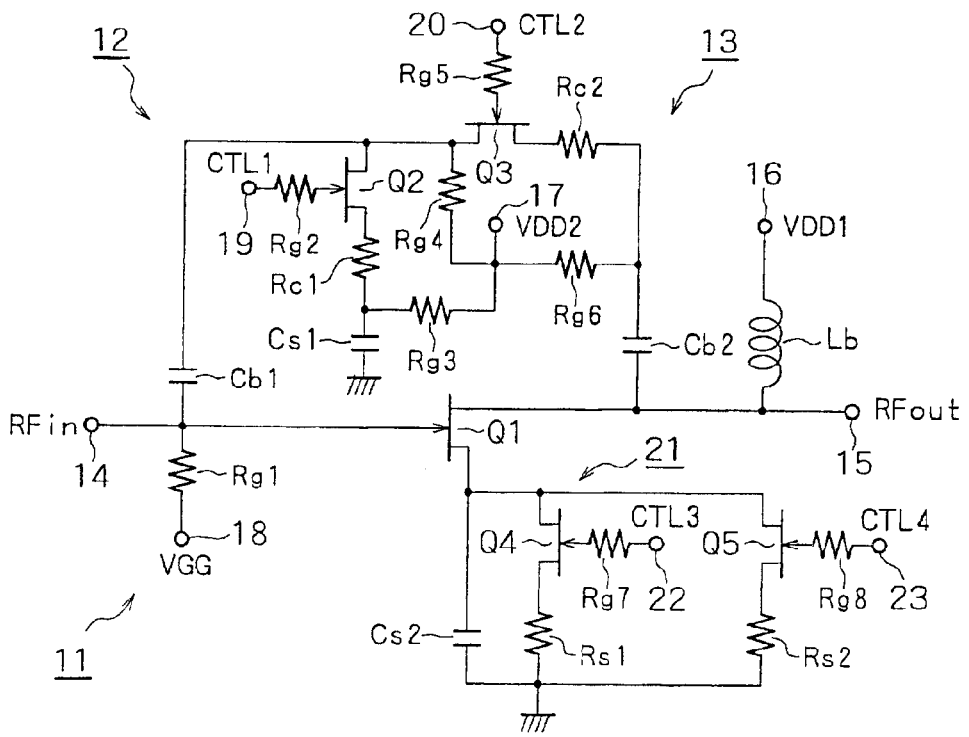
FIG. 2 is a circuit diagram showing a gain-controlled radio-frequency amplifier circuit according to a second embodiment of the present invention.

FIG. 2 is a circuit diagram showing a gain-controlled radio-frequency amplifier circuit, which is a semiconductor integrated circuit according to a second embodiment of the present invention. In the figure, the same parts as in FIG. 1 are identified by the same reference numerals. The gain-controlled radio-frequency amplifier circuit according to the second embodiment includes, as a new component, a control circuit unit 21 for effecting control to reduce the drain bias current of a signal amplifying FET Q1 according to gain attenuation steps in addition to the amplifier circuit unit 11 and the first and second bypass circuit units 12 and 13 in the gain-controlled radio-frequency amplifier circuit according to the first embodiment.

Specific configurations of the amplifier circuit unit 11 and the first and second bypass circuit units 12 and 13 are identical with those of the first embodiment, and therefore, their descriptions will be omitted. A specific circuit configuration of the control circuit unit 21 will be described in the following.

The control circuit unit 21 has a plurality of bias current interrupting FETs, for example, two bias current interrupting FETs Q4 and Q5, resistances Rg7 and Rg8, self-bias resistances Rs1 and Rs2, and a grounding capacitance Cs2. As with the signal amplifying FET Q1 and signal bypassing FETs Q2 and Q3, the bias current interrupting FETs Q4 and Q5 are each formed by a device using a compound semiconductor.

The source of the signal amplifying FET Q1 is grounded via the grounding capacitance Cs2. The source of the signal amplifying FET Q1 is connected with drains of the bias current interrupting FETs Q4 and Q5. The resistances Rg7 and Rg8 are connected between gates of the bias current interrupting FETs Q4 and Q5 and control terminals 22 and 23, respectively, and supply the gates of the bias current interrupting FETs Q4 and Q5 with drain bias current control voltages CTL3 and CTL4 applied to the control terminals 22 and 23, respectively. The self-bias resistances Rs1 and Rs2 are connected between sources of the bias current interrupting FETs Q4 and Q5, respectively, and a ground.

The thus formed, gain-controlled radio-frequency amplifier circuit according to the second embodiment can effect stepwise control of the drain bias current by fixing a bias voltage VGG applied to a bias input terminal 18 and changing a self-bias resistance value stepwise while achieving stabilization of the bias current by the self-bias circuit formed by the resistances Rs1 and Rs2 and connected to the source side of the signal amplifying FET Q1. Circuit operation of a gain control circuit unit, that is, the first and second bypass circuit units 12 and 13, is the same as in the first embodiment. Therefore, only circuit operations of the control circuit unit 21 for controlling the drain bias current at the times of high gain, medium gain, and low gain (attenuation) will be described in the following.

At the time of high gain, the bias current interrupting FETs Q4 and Q5 are both turned on by controlling the drain bias current control voltages CTL3 and CTL4 applied to the control terminals 22 and 23. In this case, the drain bias current is set to the value given by the self-bias resistance value of the combination of the resistances Rs1 and Rs2 in parallel with each other, that is, Rs1·Rs2/(Rs1+Rs2).

At the time of medium gain, the bias current interrupting FET Q4 is turned on and the FET Q5 is turned off by controlling the drain bias current control voltages CTL3 and CTL4 applied to the control terminals 22 and 23. In this case, the drain bias current is reduced to the value given by the self-bias resistance value of only the resistance Rs1. Of course, Rs1>Rs1·Rs2/(Rs1+Rs2).

At the time of low gain (attenuation), the bias current interrupting FETs Q4 and Q5 are both turned off by controlling the drain bias current control voltages CTL3 and CTL4 applied to the control terminals 22 and 23. In this case, the self-bias resistance value is infinite, and therefore, the drain bias current is interrupted completely.

As described above, the gain-controlled radio-frequency amplifier circuit according to the second embodiment is configured to change the drain bias current stepwise by the control circuit unit 21 by controlling the drain bias current control voltages CTL3 and CTL4 in correspondence with the times of high gain, medium gain, and low gain. Therefore, as compared with the gain-controlled radio-frequency amplifier circuit according to the first embodiment configured to control the bias voltage VGG, the gain-controlled radio-frequency amplifier circuit according to the second embodiment can change the drain bias current more easily.

It is to be noted that while the control circuit unit 21 according to the second embodiment uses the two bias current interrupting FETs Q4 and Q5 to change the drain bias current to three levels in correspondence with the times of high gain, medium gain, and low gain, the control circuit unit 21 according to the second embodiment is not necessarily limited to the changing of the drain bias current to the three levels, and it may change the drain bias current to more levels by increasing the number of bias current interrupting FETs.

[Third Embodiment]

Figure 3:
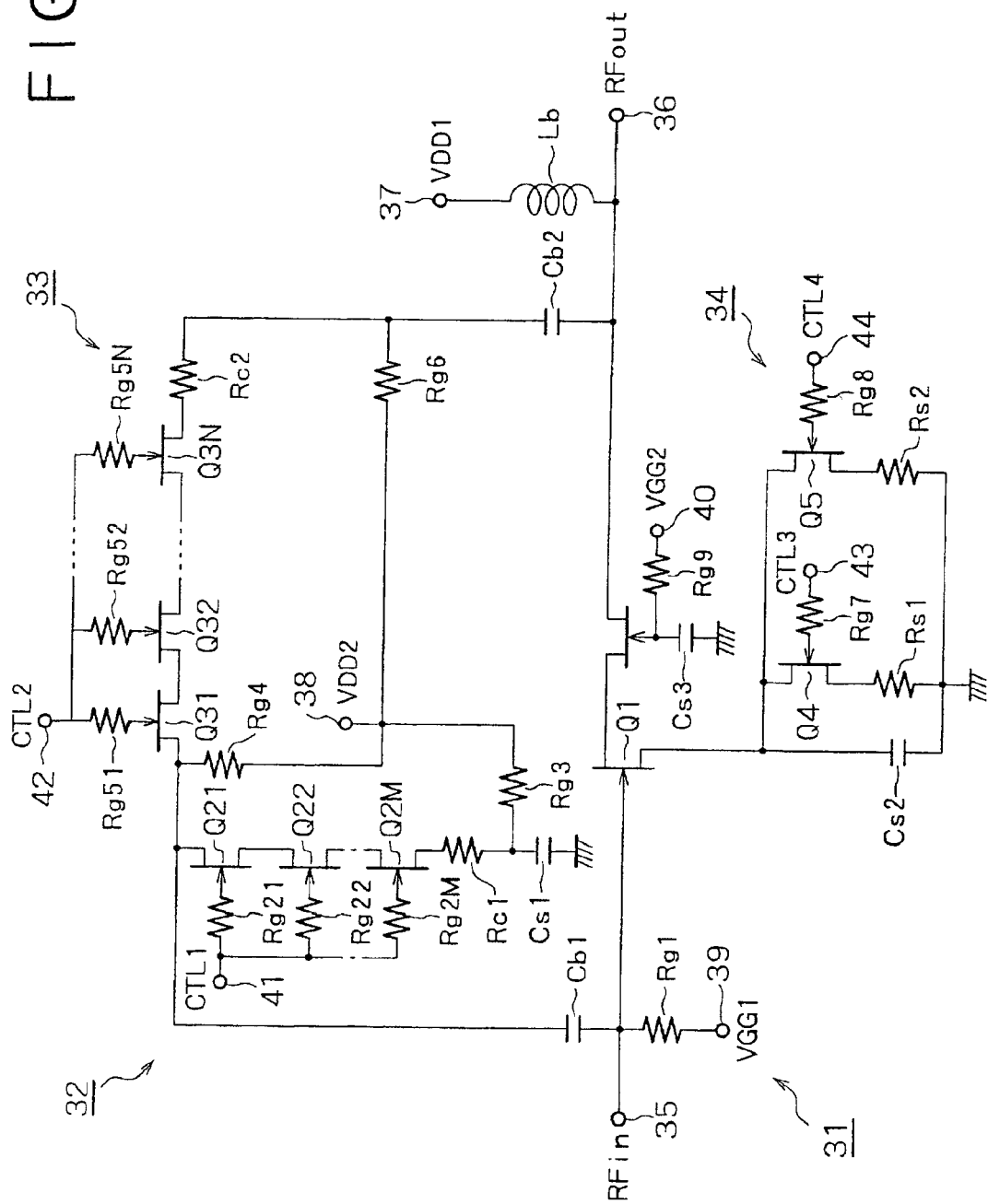
FIG. 3 is a circuit diagram showing a gain-controlled radio-frequency amplifier circuit according to a third embodiment of the present invention.

FIG. 3 is a circuit diagram showing a gain-controlled radio-frequency amplifier circuit, which is a semiconductor integrated circuit according to a third embodiment of the present invention.

The gain-controlled radio-frequency amplifier circuit according to the third embodiment includes an amplifier circuit unit 31, the first and second bypass circuit units 32 and 33, and a control circuit unit 34. The gain-controlled radio-frequency amplifier circuit according to the third embodiment includes: a signal input terminal 35 to which an input signal RFin is applied; a signal output terminal 36 from which an output signal RFout is derived; bias input terminals 37 and 38 to which bias voltages VDD1 and VDD2 are applied, respectively; bias input terminals 39 and 40 to which bias voltages VGG1 and VGG2 are applied, respectively; bypass control terminals 41 and 42 to which bypass control voltages CTL1 and CTL2 are externally applied, respectively; and control terminals 43 and 44 to which drain bias current control voltages CTL3 and CTL4 are externally applied, respectively.

Next, specific circuit configurations of the amplifier circuit unit 31, the first and second bypass circuit units 32 and 33, and the control circuit unit 34 will be described. Circuit components having the same functions as those in FIG. 1 are identified by the same reference numerals.

The amplifier circuit unit 31 has a FET Q6, a bypass capacitance Cs3, a bias resistance Rg9, a signal amplifying FET Q1, a bias resistance Rg1, and a choke coil Lb. The FET Q6 is cascade-connected with the signal amplifying FET Q1. Specifically, a source of the FET Q6 is connected to a drain of the signal amplifying FET Q1, and an output is extracted from a drain of the FET Q6.

The cascade-connected amplifier circuit can obtain a higher gain than a one-stage FET amplifier circuit. A gate of the FET Q6 is grounded via the bypass capacitance Cs3. The bias voltage VGG2 applied to the bias input terminal 40 is supplied to the gate of the FET Q6 as a gate bias voltage of the FET Q6 via the bias resistance Rg9.

Connected relations of the signal amplifying FET Q1, the bias resistance Rg1, and the choke coil Lb are the same as in the amplifier circuit unit 11 according to the first embodiment. As in the case of the second embodiment, the third embodiment is provided with the control circuit unit 34, and hence a source of the signal amplifying FET Q1 is grounded via a grounding capacitance Cs2 of the control circuit unit 34.

The fundamental configuration of the first bypass circuit unit 32, formed by a signal bypassing FET Q2, a bypass signal strength adjusting resistance Rc1, resistances Rg2 to Rg4, a coupling capacitance Cb1, and a grounding capacitance Cs1, is the same as that of the first bypass circuit unit 12 according to the first embodiment. However, the signal bypassing FET Q2 is formed by M (M is an integer of 1 or more) FETs connected in series with each other.

Specifically, a drain of a FET Q21 in a first stage is connected to a gate of the signal amplifying FET Q1 via the coupling capacitance Cb1. A source of the FET Q21 is connected to a drain of a FET Q22 in a second stage. FETs in succeeding stages are connected in the same connected relation. Finally, a source of a FET Q2M−1 in a (M−1)th stage is connected to a drain of a FET Q2M in a final stage. The bypass control voltage CTL1 applied to the bypass control terminal 41 is supplied to gates of the FETs Q21 to Q2M in these stages via resistances Rg21 to Rg2M, respectively.

Connected relations of the other circuit components in the first bypass circuit unit 32, that is, the bypass signal strength adjusting resistance Rc1, the resistances Rg3 and Rg4, the coupling capacitance Cb1, and the grounding capacitance Cs1, are the same as in the first bypass circuit unit 12 according to the first embodiment.

The fundamental configuration of the second bypass circuit unit 33, formed by a signal bypassing FET Q3, a bypass power adjusting resistance Rc2, resistances Rg5 and Rg6, and a coupling capacitance Cb2, is also the same as that of the second bypass circuit unit 13 according to the first embodiment. However, the signal bypassing FET Q3 is formed by N (N is an integer of 1 or more) FETs connected in series with each other.

Specifically, a drain of a FET Q31 in a first stage is connected to the gate of the signal amplifying FET Q1 via the coupling capacitance Cb1. A source of the FET Q31 is connected to a drain of a FET Q32 in a second stage. FETs in succeeding stages are connected in the same connected relation. Finally, a source of a FET Q3N−1 in a (N−1)th stage is connected to a drain of a FET Q3N in a final stage. The bypass control voltage CTL2 applied to the bypass control terminal 42 is supplied to the gates of the FETs Q31 to Q3N in these stages via resistances Rg51 to Rg5N, respectively.

Connected relations of the other circuit components in the second bypass circuit unit 33, that is, the bypass power adjusting resistance Rc2, the resistance Rg6, and the coupling capacitance Cb2, are the same as in the second bypass circuit unit 13 according to the first embodiment.

The thus formed, gain-controlled radio-frequency amplifier circuit according to the third embodiment has the same configuration as the gain-controlled radio-frequency amplifier circuit according to the second embodiment, except that the plurality of signal bypassing FETs Q2 and Q3 are connected in series with each other. Therefore, the fundamental gain control operation of the gain-controlled radio-frequency amplifier circuit according to the third embodiment is the same as that of the gain-controlled radio-frequency amplifier circuit according to the second embodiment. However, the gain-controlled radio-frequency amplifier circuit according to the third embodiment is advantageous when applied to a higher-frequency band.

This is because, although the drain-to-source resistance when the FET is off may be assumed to be infinite, since the drain-to-source capacitance Coff for a gate width of 400 $\mu$m in the case of a GaAs FET is about 0.1 pF, the one-stage signal bypassing FETs Q2 and Q3 cannot be ignored especially in higher-frequency applications, causing a decrease in the maximum gain when the FETs for bypassing to the ground side and the output side (Q2 and Q3) are cut off.

Thus, by the multiple-stage connection of the signal bypassing FETs Q2 and Q3, as in the gain-controlled radio-frequency amplifier circuit according to the third embodiment, it is possible to reduce the total drain-to-source capacitance Coff and therefore, to avoid the adverse effects of a decrease in gain. Incidentally, an arbitrary number may be set for each of the numbers M and N of stages for the multiple-stage connection of the signal bypassing FETs Q2 and Q3, and the numbers M and N of stages may be equal to each other (M=N).

[Application]

Figure 4:
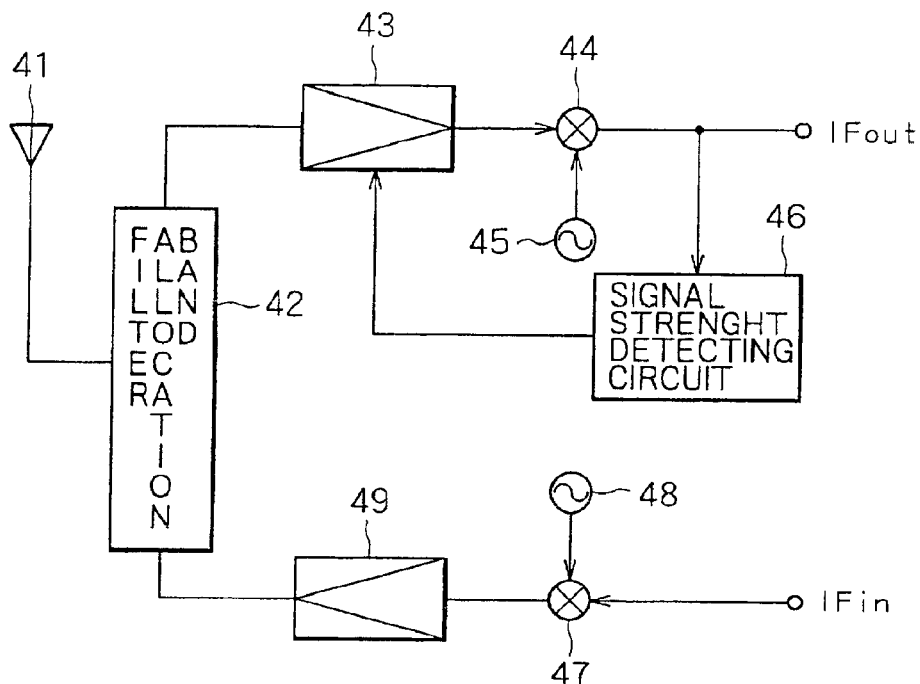
FIG. 4 is a block diagram showing an example of a configuration of an RF front end unit in a CDMA type portable telephone apparatus.
Figure 5:
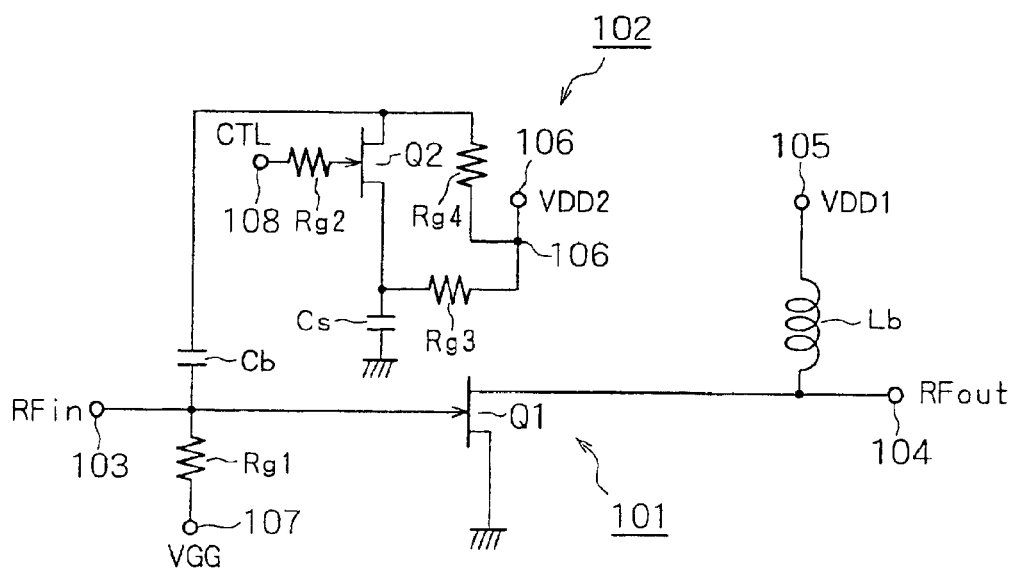
FIG. 5 is a circuit diagram showing a gain-controlled radio-frequency amplifier circuit according to a conventional example.

The gain-controlled radio-frequency amplifier circuits according to the first to third embodiments described above are used to form a gain-controlled radio-frequency amplifier circuit (AGC amplifier) of an RF front end unit in a CDMA type portable telephone apparatus, for example. FIG. 4 is a block diagram showing an example of a configuration of an RF front end unit in a CDMA type portable telephone apparatus.

In FIG. 4, a wave received by an antenna 41 is passed through a band allocation filter 42 used for both transmission and reception, changed to a certain signal level by an AGC amplifier 43, and then supplied to a mixer 44. The received wave is converted by the mixer 44 into an intermediate frequency (IF) by being mixed with a local oscillation frequency from a local oscillator 45 and then supplied to a signal strength detecting circuit 46 and a baseband IC (not shown) in a succeeding stage.

On the transmitting side, an IF signal supplied from a baseband IC in a preceding stage is supplied to a mixer 47 and mixed with a local oscillation frequency from a local oscillator 48 and thereby, converted into an RF signal. The RF signal is amplified by a power amplifier 49, passed through the band allocation filter 42, and then supplied to the antenna 41 and transmitted as a radio wave from the antenna 41.

The gain-controlled radio-frequency amplifier circuits according to the first to third embodiments described above are used as the AGC amplifier 43 on the receiving side in the thus formed RF front end unit of the CDMA type portable telephone apparatus. The signal strength detecting circuit 46 detects the signal strength of the received input signal on the basis of the IF signal, for example, and supplies a control signal corresponding to the strength to the AGC amplifier 43 as bypass control voltages CTL1 and CTL2 and drain bias current control voltages CTL3 and CTL4.

Thus, by using the gain-controlled radio-frequency amplifier circuits according to the first to third embodiments as the AGC amplifier 43 in the receiving front end unit of a portable type radio communication apparatus required to lower current consumption severely, such as a portable telephone, it is possible to reduce current consumption at the time of gain attenuation while maintaining IIP3 characteristics at an undegraded level. On average, current consumption can be reduced to less than half that of a conventional technique. Therefore, when applied to a portable terminal required to be driven by a small battery, the gain-controlled radio-frequency amplifier circuits according to the first to third embodiments can greatly contribute to longer operation.

It is to be noted that while the foregoing application has been described by taking as an example a case where the gain-controlled radio-frequency amplifier circuits are applied to a CDMA type portable telephone apparatus, the present invention is not limited to that application and it is applicable to radio communication apparatus in general.

As described above, according to the present invention, a semiconductor integrated circuit having at least one signal amplifying transistor or a radio communication apparatus using the semiconductor integrated circuit in an RF front end unit thereof includes: a means for bypassing a part of an input signal to a ground side according to the strength of the input signal; and a means for bypassing a part of the input signal to an output side according to the strength of the input signal, whereby gain attenuation control is effected. It is thus possible to reduce current consumption at the time of gain attenuation while maintaining IIP3 characteristics at an undegraded level.

While the preferred embodiments of the present invention have been described using the specific terms, such description is for illustrative purposes only, and it is to be understood that changes and variations may be made without departing from the spirit or scope of the following claims.

What is claimed is:

1. A semiconductor integrated circuit comprising:
   at least one signal amplifying transistor for amplifying an input signal supplied to a gate thereof;
   a first bypassing means for bypassing a part of said input signal to a ground side according to the strength of said input signal; and a second bypassing means for bypassing a part of said input signal to an output side according to the strength of said input signal.

2. A semiconductor integrated circuit as claimed in claim 1,
wherein said first bypassing means includes:
a first bypassing transistor having a drain connected to a bias voltage applying terminal via a resistance and connected to the gate of said signal amplifying transistor via a capacitance, and a gate connected to a first bypass control voltage applying terminal via a resistance; and
a first bias signal strength adjusting resistance having one end connected to a source of said first bypassing transistor, and another end connected to said bias voltage applying terminal via a resistance and grounded via a capacitance.

3. A semiconductor integrated circuit as claimed in claim 2,
wherein said first bypassing transistor is formed by M (M is an integer of 1 or more) transistors connected in series with each other such that a source of a transistor in a preceding stage is connected to a drain of a transistor in a succeeding stage; and
each of the gates of the M transistors is connected to said first bypass control voltage applying terminal via a resistance.

4. A semiconductor integrated circuit as claimed in claim 2,
wherein said second bypassing means includes:
a second bypassing transistor having a drain connected to the drain of said first bypassing transistor, and a gate connected to a second bypass control voltage applying terminal via a resistance; and
a second bias signal strength adjusting resistance having one end connected to a source of said second bypassing transistor, and another end connected to said bias voltage applying terminal via a resistance and connected to a drain of said signal amplifying transistor via a capacitance.

5. A semiconductor integrated circuit as claimed in claim 4,
wherein a source of said signal amplifying transistor is grounded via a capacitance; and
said control means includes:
a plurality of bias current controlling transistors whose drains are each connected to the source of said signal amplifying transistor and whose gates are connected to a plurality of drain bias current control voltage applying terminals via resistances; and
a plurality of self-bias resistances each having one end connected to one of the sources of said plurality of bias current controlling transistors, and each having another end connected to a reference potential.

6. A semiconductor integrated circuit as claimed in claim 1, further including a control means for decreasing a drain bias current of said signal amplifying transistor when said first bypassing means bypasses the part of said input signal to the ground side, and interrupting the drain bias current of said signal amplifying transistor when said second bypassing means bypasses the part of said input signal to the output side.

7. A semiconductor integrated circuit as claimed in claim 6,
wherein a source of said signal amplifying transistor is connected to said control means including a transistor; and
a gate of said transistor is connected to a drain bias current control voltage applying terminal via a resistance.

8. A semiconductor integrated circuit as claimed in claim 6,
wherein a source of said signal amplifying transistor is grounded via a capacitance; and
said control means includes:
a plurality of bias current controlling transistors whose drains are each connected to the source of said signal amplifying transistor and whose gates are connected to a plurality of drain bias current control voltage applying terminals via resistances; and
a plurality of self-bias resistances each having one end connected to one of the sources of said plurality of bias current controlling transistors, and each having another end connected to a reference potential.

9. A semiconductor integrated circuit as claimed in claim 4,
wherein said semiconductor integrated circuit brings said first bypassing transistor and said second bypassing transistor into an OFF state and brings said signal amplifying transistor into an on state when said semiconductor integrated circuit performs a high gain operation.

10. A semiconductor integrated circuit as claimed in claim 9,
wherein said semiconductor integrated circuit brings said first bypassing transistor into an off state, brings said second bypassing transistor into an ON state, and brings said signal amplifying transistor into an off state when said semiconductor integrated circuit performs a low gain operation.

11. A radio communication apparatus comprising:
an antenna;
an AGC (Auto Gain Control) amplifier for amplifying a signal received by said antenna;
a mixer for mixing an output signal from said AGC amplifier with a predetermined frequency; and
a signal strength detecting circuit for detecting the signal strength of the received signal;
said AGC amplifier including:
at least one signal amplifying transistor for amplifying an input signal supplied to a gate thereof;
a first bypassing means for bypassing a part of said input signal to a ground side according to the strength of said input signal; and
a second bypassing means for bypassing a part of said input signal to an output side according to the strength of said input signal.

12. A radio communication apparatus as claimed in claim 11,
wherein said first bypassing means includes:
a first bypassing transistor having a drain connected to a bias voltage applying terminal via a resistance and connected to the gate of said signal amplifying transistor via a capacitance, and a gate connected to a first bypass control voltage applying terminal via a resistance; and
a first bias signal strength adjusting resistance having one end connected to a source of said first bypassing transistor, and another end connected to said bias voltage applying terminal via a resistance and grounded via a capacitance.

13. A radio communication apparatus as claimed in claim 12,
wherein said first bypassing transistor is formed by M (M is an integer of 1 or more) transistors connected in series with each other such that a source of a transistor in a preceding stage is connected to a drain of a transistor in a succeeding stage; and
each of the gates of the M transistors is connected to said first bypass control voltage applying terminal via a resistance.

14. A radio communication apparatus as claimed in claim 12,
wherein said second bypassing means includes:
a second bypassing transistor having a drain connected to the drain of said first bypassing transistor, and a gate connected to a second bypass control voltage applying terminal via a resistance; and
a second bias signal strength adjusting resistance having one end connected to a source of said second bypassing transistor, and another end connected to said bias voltage applying terminal via a resistance and connected to a drain of said signal amplifying transistor via a capacitance.

15. A radio communication apparatus as claimed in claim 14,
wherein said second bypassing transistor is formed by N (N is an integer of 1 or more) transistors connected in series with each other such that a source of a transistor in a preceding stage is connected to a drain of a transistor in a succeeding stage; and
each of the gates of the N transistors is connected to said second bypass control voltage applying terminal via a resistance.

16. A radio communication apparatus as claimed in claim 11, further including a control means for decreasing a drain bias current of said signal amplifying transistor when said first bypassing means bypasses the part of said input signal to the ground side, and interrupting the drain bias current of said signal amplifying transistor when said second bypassing means bypasses the part of said input signal to the output side.

17. A radio communication apparatus as claimed in claim 16,
wherein a source of said signal amplifying transistor is connected to said control means including a transistor; and
a gate of said transistor is connected to a drain bias current control voltage applying terminal via a resistance.

18. A radio communication apparatus as claimed in claim 16,
wherein a source of said signal amplifying transistor is grounded via a capacitance; and
said control means includes:
a plurality of bias current controlling transistors whose drains are each connected to the source of said signal amplifying transistor and whose gates are connected to a plurality of drain bias current control voltage applying terminals via resistances; and
a plurality of self-bias resistances, each having one end connected to one of the sources of said plurality of bias current controlling transistors, and each having another end connected to a reference potential.

19. A radio communication apparatus as claimed in claim 14,
wherein said AGC amplifier brings said first bypassing transistor and said second bypassing transistor into an OFF state and brings said signal amplifying transistor into an on state when said AGC amplifier performs a high gain operation.

20. A radio communication apparatus as claimed in claim 19,
wherein said AGC amplifier brings said first bypassing transistor into an off state, brings said second bypassing transistor into an ON state, and brings said signal amplifying transistor into an off state when said AGC amplifier performs a low gain operation.

* * * * *

UNITED STATES PATENT AND TRADEMARK OFFICE
CERTIFICATE OF CORRECTION

PATENT NO. : 6,999,740 B2
APPLICATION NO. : 10/084318
DATED : February 28, 2002
INVENTOR(S) : Takahiro Ogihara It is certified that error appears in the above-identified patent and that said Letters Patent is hereby corrected as shown below:

Column 12:
Line 24, "on state" should read -- ON state --.

Line 30, "off state" should read -- OFF state --.

Line 32, "off state" should read -- OFF state --.

Column 14:
Line 30, "on state" should read -- ON state --.

Line 35, "off state" should read -- OFF state --.

Line 37, "off state" should read -- OFF state --.

Signed and Sealed this

Twentieth Day of February, 2007

JON W. DUDAS
*Director of the United States Patent and Trademark Office*

UNITED STATES PATENT AND TRADEMARK OFFICE
CERTIFICATE OF CORRECTION

PATENT NO. : 6,999,740 B2  Page 1 of 1
APPLICATION NO. : 10/084318
DATED : February 14, 2006
INVENTOR(S) : Takahiro Ogihara It is certified that error appears in the above-identified patent and that said Letters Patent is hereby corrected as shown below:

Column 12:
Line 24, "on state" should read -- ON state --.

Line 30, "off state" should read -- OFF state --.

Line 32, "off state" should read -- OFF state --.

Column 14:
Line 30, "on state" should read -- ON state --.

Line 35, "off state" should read -- OFF state --.

Line 37, "off state" should read -- OFF state --.

This certificate supersedes Certificate of Correction issued February 20, 2007.

Signed and Sealed this

Thirteenth Day of March, 2007

JON W. DUDAS
*Director of the United States Patent and Trademark Office*